(12) United States Patent
Hsu et al.

(10) Patent No.: US 10,793,426 B2
(45) Date of Patent: Oct. 6, 2020

(54) MICROELECTROMECHANICAL SYSTEM STRUCTURE AND METHOD FOR FABRICATING THE SAME

(71) Applicant: United Microelectronics Corp., Hsinchu (TW)

(72) Inventors: Chang-Sheng Hsu, Hsinchu (TW); Chih-Fan Hu, Taoyuan (TW); Chia-Wei Lee, Kaohsiung (TW); En Chan Chen, Taipei (TW); Shih-Wei Li, Taoyuan (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 16/107,795

(22) Filed: Aug. 21, 2018

(65) Prior Publication Data

US 2018/0354783 A1 Dec. 13, 2018

Related U.S. Application Data

(62) Division of application No. 15/146,741, filed on May 4, 2016, now Pat. No. 10,087,072.

(51) Int. Cl.
*B81C 1/00* (2006.01)

(52) U.S. Cl.
CPC .... *B81C 1/00246* (2013.01); *B81B 2207/015* (2013.01); *B81B 2207/07* (2013.01);
(Continued)

(58) Field of Classification Search
CPC combination set(s) only.
See application file for complete search history.

(56) References Cited

U.S. PATENT DOCUMENTS

| 8,350,346 B1 | 1/2013 | Huang et al. |
| 8,841,755 B2 | 9/2014 | Huang et al. |

(Continued)

OTHER PUBLICATIONS

Lalitha Parameswaran, et al., "A Merged MEMS-CMOS Process using Silicon Wafer Bonding," International Electron Devices Meeting (IEDM '95), Dec. 10-13, 1995, pp. 613-616.

(Continued)

*Primary Examiner* — Michelle Mandala
*Assistant Examiner* — Jordan M Klein
(74) *Attorney, Agent, or Firm* — J.C. Patents

(57) ABSTRACT

A microelectromechanical system structure and a method for fabricating the same are provided. A method for fabricating a MEMS structure includes the following steps. A first substrate is provided, wherein a transistor, a first dielectric layer and an interconnection structure are formed thereon. A second substrate is provided, wherein a second dielectric layer and a thermal stability layer are formed on the second substrate. The first substrate is bonded to the second substrate, and the second substrate removed. A conductive layer is formed within the second dielectric layer and electrically connected to the interconnection structure. The thermal stability layer is located between the conductive layer and the interconnection structure. A growth temperature of a material of the thermal stability layer is higher than a growth temperature of a material of the conductive layer and a growth temperature of a material of the interconnection structure.

11 Claims, 5 Drawing Sheets

(52) U.S. Cl.
CPC .............. *B81C 2201/0176* (2013.01); *B81C 2203/036* (2013.01); *B81C 2203/0735* (2013.01)

(56) References Cited

U.S. PATENT DOCUMENTS

| | | | |
|---|---|---|---|
| 8,945,969 B2 | 2/2015 | Huang et al. | |
| 2011/0012247 A1 | 1/2011 | Wu | |
| 2011/0057288 A1 | 3/2011 | Tan et al. | |
| 2012/0074570 A1 | 3/2012 | Kolb et al. | |
| 2014/0367805 A1 | 12/2014 | Chen et al. | |
| 2015/0097215 A1* | 4/2015 | Chu | B81C 1/00238 257/254 |
| 2015/0329351 A1* | 11/2015 | Cheng | B81C 1/00238 257/417 |
| 2015/0329353 A1* | 11/2015 | Cheng | B81B 7/0041 257/415 |

OTHER PUBLICATIONS

Philip Pieters, et al., "Integration and Packaging MEMS Directly Above Active CMOS," International Symposium on High Density packaging and Microsystem Integration (HDP '07), Jun. 26-28, 2007, pp. 1.

\* cited by examiner

MICROELECTROMECHANICAL SYSTEM STRUCTURE AND METHOD FOR FABRICATING THE SAME

CROSS-REFERENCE TO RELATED APPLICATION

This is a divisional application of and claims the priority benefit of U.S. application Ser. No. 15/146,741, filed on May 4, 2016, now allowed. The entirety of the above-mentioned patent application is hereby incorporated by reference herein and made a part of this specification.

BACKGROUND OF THE INVENTION

1. Field of the Invention

The present invention generally relates to a microelectromechanical system (MEMS) structure and a fabricating method thereof, in particular, to a MEMS structure having high thermal stability and a fabricating method thereof.

2. Description of Related Art

A microelectromechanical system (MEMS) structure is a microelectromechanical device fabricated by using a microprocessing technique. Due to its advantages in light weight and small size, the MEMS structure well satisfies the current requirements for light, thin, short, and small electronic products, and is studied in many fields. The existing MEMS structures include accelerometers, switches, capacitors, sensors, microphones, and other ultra small-sized electromechanical devices.

Generally, a MEMS structure includes a CMOS device and a MEMS device. Recently, the integration of complementary metal-oxide semiconductor (CMOS) devices with the MEMS device has been commonly applied. In general, the MEMS device is formed after forming the CMOS device, and then the MEMS device may be integrated with the CMOS device in a manner of a single block. The conventional process of the MEMS device is usually performed after the back end of the CMOS process is finished. In other words, after accomplishing the fabrication of the CMOS device, a dielectric layer and material for the MEMS device are formed on the CMOS device.

However, the material for the MEMS device is usually formed at high manufacturing temperatures, i.e. the material for the MEMS device has a higher growth temperature. Accordingly, the material for the MEMS device with a higher growth temperature is called a thermal stability material. Since the material used after the CMOS device usually has a lower growth temperature, the higher growth temperature for the material in the MEMS device may cause damage to the electrical performance of the CMOS device. Therefore, how to integrate a MEMS device with a CMOS device while providing a good thermal stability material during high temperature processes is an object being actively researched for those skilled in the art.

SUMMARY OF THE INVENTION

Accordingly, the present invention is directed to a microelectromechanical system (MEMS) structure and a fabricating method thereof, wherein a thermal stability material can be provided in the MEMS structure and a good reliability to the MEMS structure can be inferred.

The invention provides a MEMS structure including a substrate, a dielectric layer, an interconnection structure, a thermal stability layer and a conductive layer. The substrate has a transistor disposed thereon. The dielectric layer is disposed on the substrate. The interconnection structure is disposed within the dielectric layer and is electrically connected to the transistor. The thermal stability layer is disposed within the dielectric layer and located above the interconnection structure. The conductive layer is disposed within the dielectric layer and electrically connected to the interconnection structure, wherein the thermal stability layer is located in between the conductive layer and the interconnection structure. A growth temperature of a material of the thermal stability layer is higher than a growth temperature of a material of the conductive layer and a growth temperature of a material of the interconnection structure.

In an embodiment of the invention, the substrate and the dielectric layer further includes a cavity formed therein, wherein the cavity exposes a region of the interconnection structure.

In an embodiment of the invention, the material of the thermal stability layer includes polysilicon, low pressure silicon nitride (LP-SiN) or amorphous silicon.

In an embodiment of the invention, the material of the interconnection structure includes Ti, TiN, Al, Ta, TaN, Cu, Ge, Au or Ni.

In an embodiment of the invention, the material of the conductive layer includes Ti, TiN, Al, Ta, TaN, Cu, Ge, Au or Ni.

In an embodiment of the invention, the growth temperature of the material of the thermal stability layer is above 500° C.

In an embodiment of the invention, the growth temperature of the material of the interconnection structure is from 50° C. to 450° C.

In an embodiment of the invention, the growth temperature of the material of the conductive layer is from 50° C. to 450° C.

The invention further provides a method for fabricating a MEMS structure. The method includes the following steps. A first substrate is provided, wherein a transistor, a first dielectric layer and an interconnection structure are formed thereon. The transistor is disposed on the first substrate, the first dielectric layer is disposed on the first substrate and covering the transistor, and the interconnection structure is disposed within the first dielectric layer and electrically connected to the transistor. A second substrate is provided, wherein a second dielectric layer and a thermal stability layer are formed on the second substrate. The second dielectric layer is disposed on the second substrate, and the thermal stability layer is located within the second dielectric layer. The first substrate is bonded to the second substrate. The second substrate is then removed. A conductive layer is formed within the second dielectric layer, wherein the conductive layer is electrically connected to the interconnection structure. The thermal stability layer is located between the conductive layer and the interconnection structure, and wherein a growth temperature of a material of the thermal stability layer is higher than a growth temperature of a material of the conductive layer and a growth temperature of a material of the interconnection structure.

In an embodiment of the invention, the method for fabricating the MEMS structure further includes removing a part of the first substrate and a part of the first dielectric layer after forming the conductive layer to form a cavity that exposes a region of the interconnection structure.

In an embodiment of the invention, the bonding of the first substrate to the second substrate is performed by fusion bonding between the first dielectric layer and the second dielectric layer.

In an embodiment of the invention, the material of the thermal stability layer includes polysilicon, low pressure silicon nitride (LP-SiN) or amorphous silicon.

In an embodiment of the invention, the material of the interconnection structure includes Ti, TiN, Al, Ta, TaN, Cu, Ge, Au or Ni.

In an embodiment of the invention, the material of the conductive layer includes Ti, TiN, Al, Ta, TaN, Cu, Ge, Au or Ni.

In an embodiment of the invention, the growth temperature of the material of the thermal stability layer is above 500° C.

In an embodiment of the invention, the growth temperature of the material of the interconnection structure is from 50° C. to 450° C.

In an embodiment of the invention, the growth temperature of the material of the conductive layer is from 50° C. to 450° C.

In an embodiment of the invention, the first dielectric layer is formed by plasma-enhanced chemical vapor deposition (PECVD), sub-atmospheric chemical vapor deposition (SACVD) or high density plasma chemical vapor deposition (HDP-CVD).

In an embodiment of the invention, the second dielectric layer is formed by PECVD, SACVD or HDP-CVD.

Based on the above, the MEMS structure is fabricated by bonding the second substrate to the first substrate. The first substrate includes the transistor and the interconnection structure formed thereon, and the second substrate includes a thermal stability layer formed thereon, wherein the thermal stability layer is located in between a conductive layer and the interconnection structure. Since the thermal stability layer with high growth temperature is pre-fabricated on the second substrate before bonding the second substrate to the first substrate, and located between the interconnection structure and the conductive layer after bonding the second substrate to the first substrate, therefore, the MEMS structure can have good reliability.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
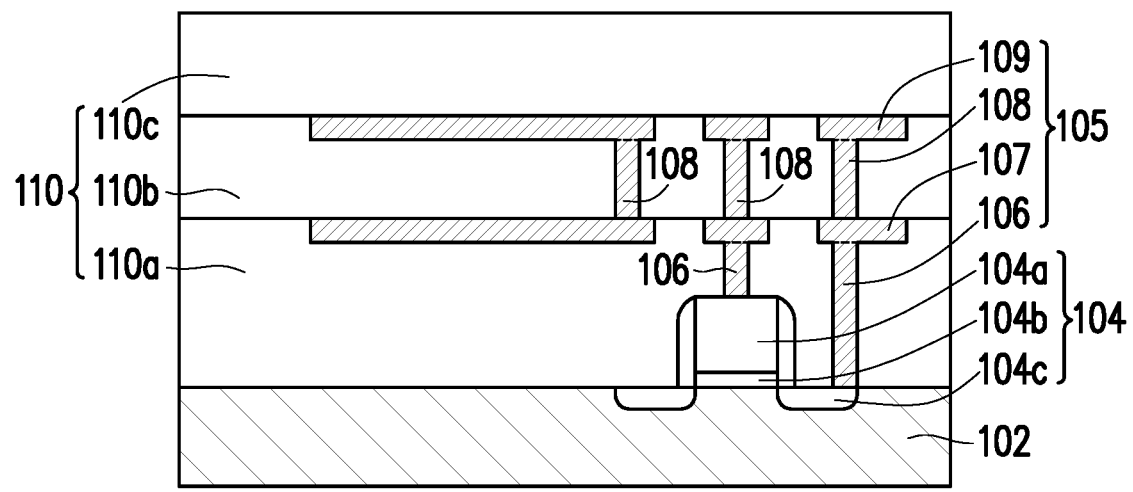
FIG. 1A to FIG. 1F are sectional diagrams of the fabricating process of a MEMS structure according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1A to FIG. 1F are sectional diagrams of the fabricating process of a MEMS structure according to an embodiment of the invention. Referring to FIG. 1A, the fabricating process of a MEMS structure of the invention includes providing a first substrate 102. The first substrate 102 is for example, a silicon substrate. A transistor 104, a first dielectric layer 110 and interconnection structure 105 are formed on the first substrate 102. The transistor 104 is disposed on the first substrate 102. The transistor 104 may be a MOS transistor, which includes a gate 104a, a gate dielectric layer 104b and doping regions 104c located in the substrate 102 at two sides of the gate 104a. In the embodiment, the doping regions 104c are used as a source and a drain of a transistor. Herein, the first substrate 102 is a so-called MOS substrate with a MOS device.

The first dielectric layer 110 is disposed on the first substrate 102 and covers the transistor 104. The material of the first dielectric layer 110 is for example, silicon oxide or other suitable dielectric materials. In the present embodiment. The first dielectric layer 110 for example includes, a first part 110a, a second part 110b and a third part 110c. The method of forming the first part 110a, the second part 110b and the third part 110c of the first dielectric layer 110 will be described in detail in the successive paragraphs below.

The interconnection structure 105 is disposed within the first dielectric layer 110 and electrically connected to the transistor 104. The material of the interconnection structure 105 includes Ti, TiN, Al, Ta, TaN, Cu, Ge, Au or Ni. The interconnection structure 105 may include a plurality of conductive plugs 106, 108 and a plurality of conductive layers 107, 109. In the present embodiment, the conductive layer 107 is located above the transistor 104, and is electrically connected to the transistor 104 through the conductive plugs 106. Furthermore, the conductive layer 109 is located above the conductive layer 107, and is electrically connected to the conductive layer 107 through conductive plugs 108. The method of forming the plurality of conductive plugs 106, 108 and the plurality of conductive layers 107, 109 will be described in detail in the successive paragraphs below.

After forming the transistor 104, the first dielectric layer 110 and the interconnection structure 105 is for example manufactured by the following method. Specifically, the first part 110a of the first dielectric layer 110 is formed on the substrate 102 and covers the transistor 104. A dual damascene process was performed so as to form the conductive plugs 106 and conductive layer 107 within the first part 110a of the dielectric layer 110. Herein, the conductive layer 107 is electrically connected to the transistor 104 through the conductive plugs 106. In the next step, the second part 110b of the first dielectric layer 110 is formed on the first part 110a and covers the conductive layer 107. Another dual damascene process was performed so as to form the conductive plugs 108 and conductive layer 109 within the second part 110b of the first dielectric layer 110. Herein, the conductive layer 109 is electrically connected to the conductive layer 107 through the conductive plugs 108. A third part 110c of the first dielectric layer 110 is then formed on the second part 110b. In the above embodiment, the growth temperature of the material of the interconnection structure 105 (material for forming conductive plugs 106 and 108 and conductive layers 107 and 109) is from 50° C. to 450° C. Furthermore, each of the first part 110a, the second part 110b and the third part 110c may be formed by PECVD, SACVD or HDP-CVD.

Although only two layers of conductive plugs 106, 108 with conductive layers 107, 109 are shown in the above embodiment, it should be noted that the number of layers of the conductive plugs and conductive layers are not particularly limited and this can be adjusted based on requirements. Furthermore, the first dielectric layer 110 is defined as all the parts that cover the interconnection structure 105. That is, the number of parts of the first dielectric layer 110 may vary depending on the layers of conductive layer used.

Figure 1B:
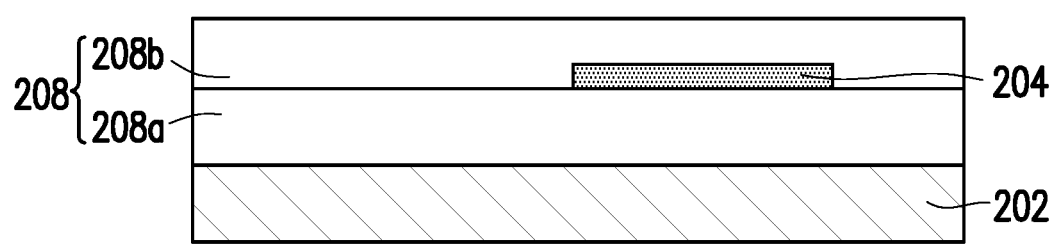

Next, referring to FIG. 1B, a second substrate 202 is provided. The second substrate 202 is for example, a silicon substrate. The second substrate 202 includes a second dielectric layer 208 and a thermal stability layer 204 that are formed on the second substrate 202. Herein, the thermal stability layer 204 refers to a layer with high growth temperature (above 500° C.). The thermal stability layer 204 may be used for the MEMS device. In the present embodiment, the second dielectric layer 208 for example includes a first part 208a and a second part 208b. The method of forming the first part 208a and the second part 208b of the second dielectric layer 208 will be described in detail in the successive paragraphs below. The material of the second dielectric layer 208 is for example, silicon oxide or other suitable dielectric materials. The material of the thermal stability layer 204 includes polysilicon, low pressure silicon nitride (LP-SiN) or amorphous silicon. Furthermore, the growth temperature of the material of the thermal stability layer 204 is above 500° C.

As shown in FIG. 1B, the second dielectric layer 208 and the thermal stability layer 204 are for example manufactured by the following method. Specifically, a first part 208a of the second dielectric layer 208 is formed to cover the second substrate 202. A thermal stability material layer is formed on top of the first part 208a and is patterned to form the thermal stability layer 204. A second part 208b of the second dielectric layer 208 is formed to cover the first part 208a and the thermal stability layer 204. In the above embodiment, each of the first part 208a and the second part 208b may be formed by PECVD, SACVD or HDP-CVD. Herein, the second substrate 202 is a so-called MEMS substrate with a MEMS device.

Figure 1C:
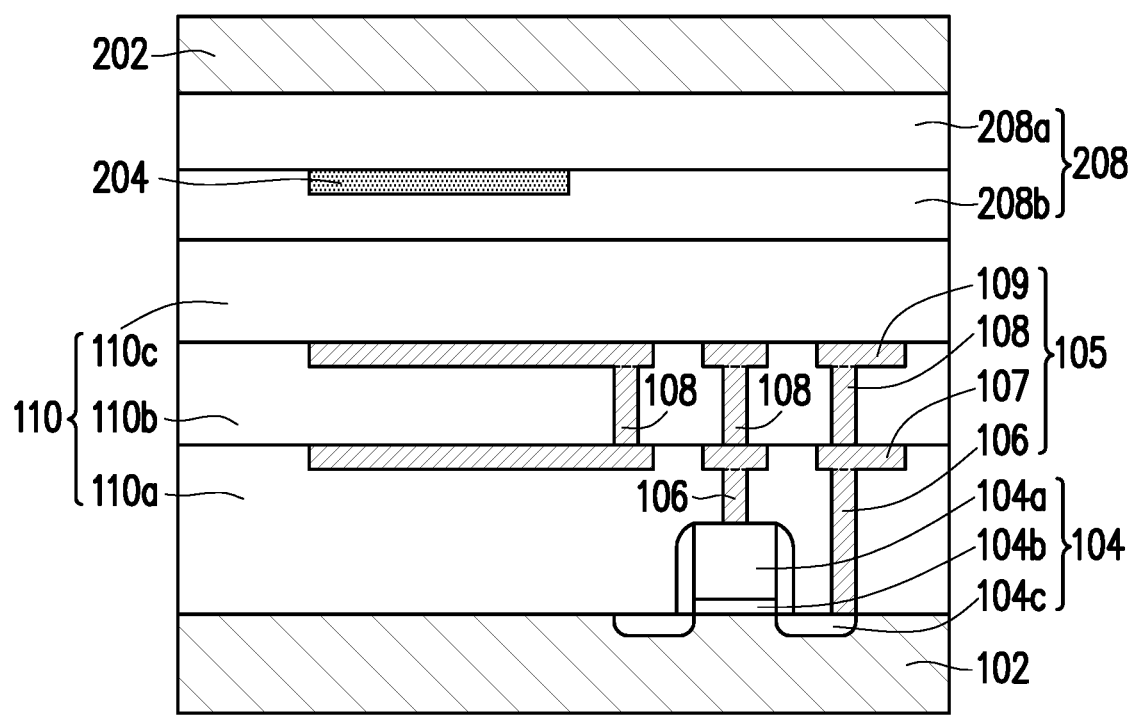

Next, referring to FIG. 1C, the first substrate 102 is bonded to the second substrate 202. In the embodiment, the bonding of the first substrate 102 to the second substrate 202 is performed by fusion bonding between the first dielectric layer 110 and the second dielectric layer 208. For instance, in an embodiment of the invention, a material of the first dielectric layer 110 and the second dielectric layer 208 is $SiO_2$. As such, the first dielectric layer 110 may be bonded to the second dielectric layer 208 through siloxane (Si—O—Si) groups. However, the present invention is not particularly limited thereto, and other types of fusion bonding may be utilized.

Figure 1D:
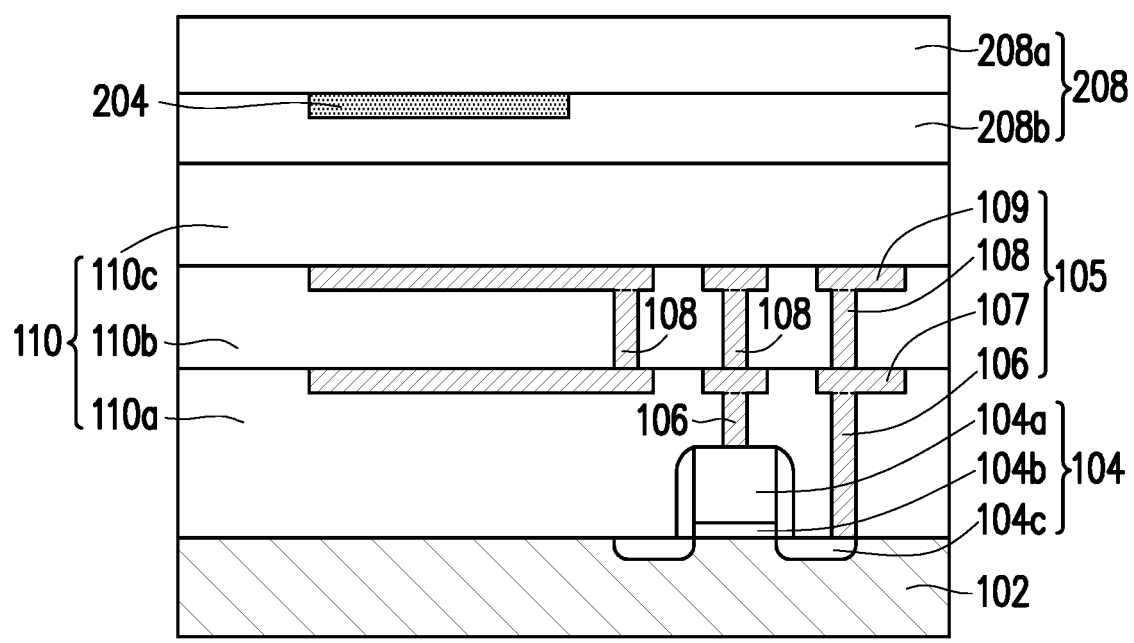

Next, referring to FIG. 1D, the second substrate 202 is removed to expose a surface of the second dielectric layer 208. In the embodiment, the second substrate 202 is for example removed by using chemical-mechanical planarization (CMP) polishing, wherein a first part 208a of the second dielectric layer 208 is exposed after the CMP process. However, the method for removing the second substrate 202 is not particularly limited thereto and other known methods may be used.

Figure 1E:
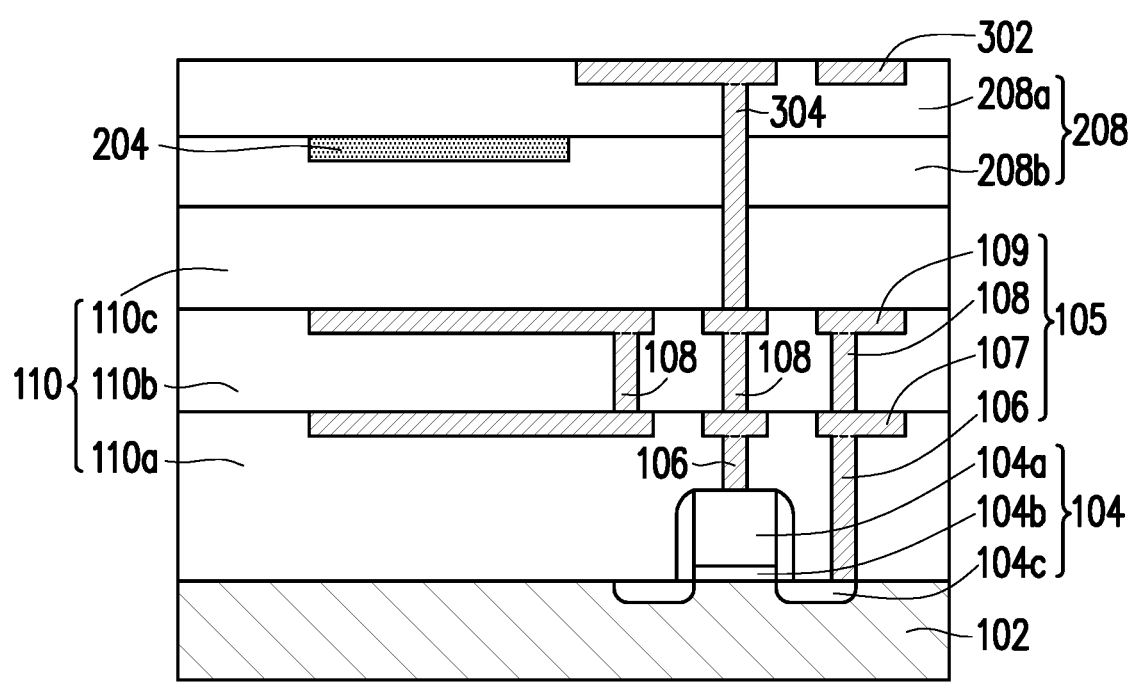

Subsequently, referring to FIG. 1E, a conductive layer 302 is formed within the second dielectric layer 208 and conductive plug 304 are formed within the second dielectric layer 208 and the third part 110c of the first dielectric layer 110 through a dual damascene process, wherein the conductive layer 302 is electrically connected to the interconnect structure 105 through the conductive plug 304. In the present embodiment, the conductive layer 302 and the conductive plug 304 together constitute a second interconnection structure. The material of the second interconnection structure (conductive layer 302 and conductive plug 304) includes Ti, TiN, Al, Ta, TaN, Cu, Ge, Au or Ni. In addition, the material of the second interconnection structure (conductive layer 302 and conductive plug 304) may have a lower growth temperature (ex. 50° C. to 450° C.).

In the above embodiment, the growth temperature of the material of the second interconnection structure (conductive layer 302 and conductive plug 304) is from 50° C. to 450° C. Therefore, when fabricating the second interconnection structure, the low fabrication temperature will not affect the low growth temperature materials used in the interconnection structure 105 and the transistor 104 of the MOS device. That is, a good reliability of the MEMS structure can be obtained.

Figure 1F:
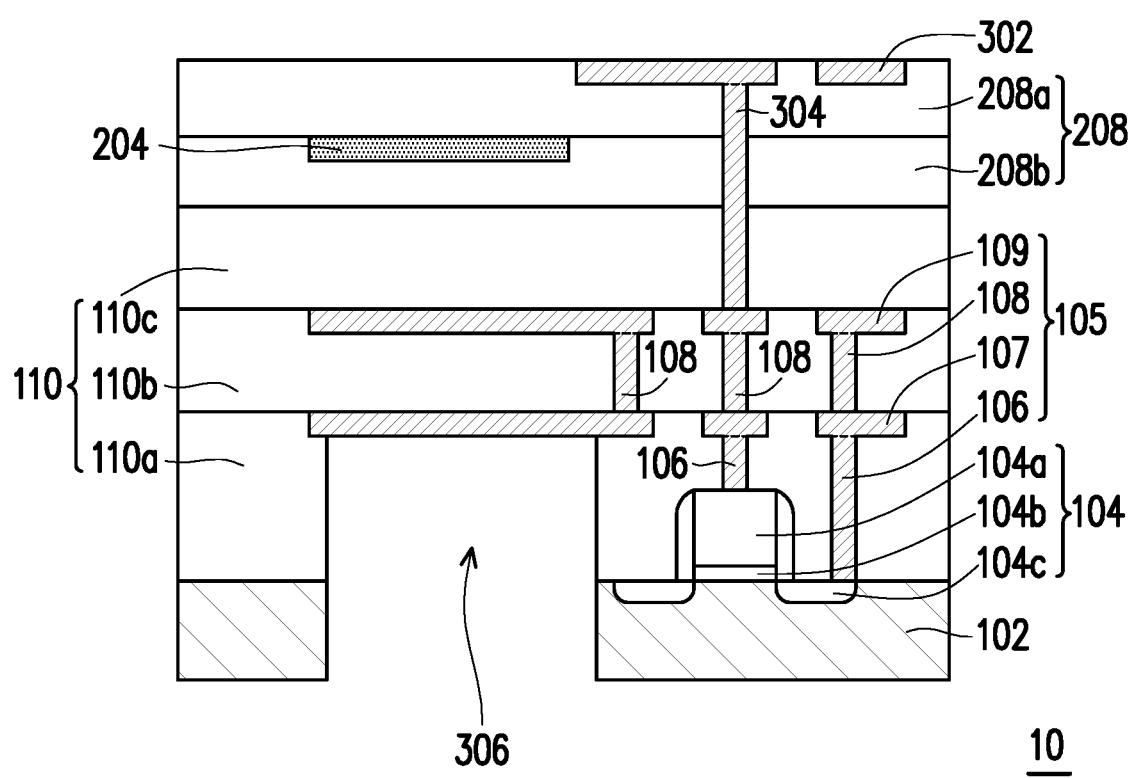

Finally, referring to FIG. 1F, a part of the first substrate 102 and a part of the first dielectric layer 110 are removed to form a cavity 306 that exposes a region of the interconnection structure 105 to complete a MEMS structure 10 of the invention. In the present embodiment, the cavity 306 exposes a portion of the conductive layer 107 of the interconnection structure 105. The part of the first substrate 102 and the part of the first dielectric layer 110 may be removed by dry etching to form a cavity 306, however, the invention is not particularly limited thereto.

In the above embodiment, the thermal stability layer 204 is formed between the conductive layer 302 and the interconnection structure 105. Furthermore, the growth temperature of the material of the thermal stability layer 204 is higher than the growth temperature of the material of the conductive layer 302 and the growth temperature of the material of the interconnection structure 105. Since the thermal stability layer 204 is pre-fabricated on the second substrate 202 with a high manufacturing/growth temperature prior to bonding the first substrate to the second substrate, therefore, the high growth temperature will not affect the low growth temperature materials used in the MOS device (interconnection structure 105 and transistor 104). In addition, since the second interconnection structure (conductive layer 302 and conductive plug 304) with a low manufacturing/growth temperature is fabricated after the bonding the first substrate to the second substrate, the low growth temperature will also not affect the low growth temperature materials used in the MOS device (interconnection structure 105 and transistor 104). As such, a good reliability of the MEMS structure can be achieved.

The MEMS structure according to an embodiment of the invention can be referred to the MEMS structure 10 according to FIG. 1F. For the MEMS structure of the invention, the thermal stability layer 204 is pre-fabricated on the second substrate 202 of the MEMS device and bonded to the first substrate of the MOS device, wherein the second interconnection structure (conductive layer 302 and conductive plug 304) is fabricated thereafter. As such, the thermal stability layer 204 having a high growth temperature will be located between the interconnection structure 105 and the conductive layer 302 having low growth temperatures. Therefore, a good reliability of the MEMS structure can be achieved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating a microelectromechanical system (MEMS) structure, comprising:
providing a first substrate, wherein a transistor, a first dielectric layer and an interconnection structure are formed thereon, the transistor is disposed on the first substrate, the first dielectric layer is disposed on the first substrate and covering the transistor, and the interconnection structure is disposed within the first dielectric layer and electrically connected to the transistor;

providing a second substrate, wherein a second dielectric layer and a thermal stability layer are formed on the second substrate, the second dielectric layer is disposed on the second substrate, and the thermal stability layer is completely encapsulated by the second dielectric layer;

bonding the first substrate to the second substrate;

removing the second substrate;

forming a conductive layer within the second dielectric layer and a conductive plug within the second dielectric layer and the first dielectric layer, wherein the conductive layer is electrically connected to the interconnection structure through the conductive plug; and removing a part of the first substrate and a part of the first dielectric layer after forming the conductive layer to form a cavity that exposes a region of the interconnection structure, wherein a MEMS device comprising the cavity and the thermal stability layer, wherein the thermal stability layer is located between a bottom of the conductive layer and the interconnection structure, and the bottom of the conductive layer is closer to the first substrate than an upper part of the conductive layer, and wherein a growth temperature of a material of the thermal stability layer is higher than a growth temperature of a material of the conductive layer and a growth temperature of a material of the interconnection structure.

2. The method for fabricating the MEMS structure according to claim 1, wherein bonding the first substrate to the second substrate is performed by fusion bonding between the first dielectric layer and the second dielectric layer.

3. The method for fabricating the MEMS structure according to claim 1, wherein the material of the thermal stability layer comprises polysilicon, low pressure silicon nitride, or amorphous silicon.

4. The method for fabricating the MEMS structure according to claim 1, wherein the material of the interconnection structure comprises Ti, TiN, Al, Ta, TaN, Cu, Ge, Au or Ni.

5. The method for fabricating the MEMS structure according to claim 1, wherein the material of the conductive layer comprises Ti, TiN, Al, Ta, TaN, Cu, Ge, Au or Ni.

6. The method for fabricating the MEMS structure according to claim 1, wherein the growth temperature of the material of the thermal stability layer is above 500° C.

7. The method for fabricating the MEMS structure according to claim 1, wherein the growth temperature of the material of the interconnection structure is from 50° C. to 450° C.

8. The method for fabricating the MEMS structure according to claim 1, wherein the growth temperature of the material of the conductive layer is from 50° C. to 450° C.

9. The method for fabricating the MEMS structure according to claim 1, wherein the first dielectric layer is formed by PECVD, SACVD or HDP-CVD.

10. The method for fabricating the MEMS structure according to claim 1, wherein the second dielectric layer is formed by PECVD, SACVD or HDP-CVD.

11. The method for fabricating the MEMS structure according to claim 1, wherein the MEMS device is disposed side-by-side with a MOS device, and the MOS device comprising the interconnection structure and the transistor.

* * * * *